United States Patent
Epstein

(10) Patent No.: US 12,206,404 B1
(45) Date of Patent: Jan. 21, 2025

(54) MULTI-BODY INTERACTION IN GALVANICALLY COUPLED QUBITS

(71) Applicant: NORTHROP GRUMMAN SYSTEMS CORPORATION, Falls Church, VA (US)

(72) Inventor: Ryan J. Epstein, Denver, CO (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 18/449,583

(22) Filed: Aug. 14, 2023

(51) Int. Cl.
*H03K 17/92* (2006.01)
(52) U.S. Cl.
CPC ................ *H03K 17/92* (2013.01)
(58) Field of Classification Search
CPC ........................................ H03K 17/92
USPC .......................................... 327/528
See application file for complete search history.

(56) References Cited

U.S. PATENT DOCUMENTS

| | | | |
|---|---|---|---|
| 9,647,662 B1* | 5/2017 | Abutaleb | H03K 19/0005 |
| 9,940,586 B1* | 4/2018 | Epstein | G06N 10/60 |
| 10,074,792 B1* | 9/2018 | Ferguson | G06N 10/40 |
| 2024/0013088 A1* | 1/2024 | Kapit | G06N 10/70 |
| 2024/0138268 A1* | 4/2024 | Enderud | H10N 69/00 |

* cited by examiner

*Primary Examiner* — Tomi Skibinski
(74) *Attorney, Agent, or Firm* — Tarolli, Sundheim, Covell & Tummino LLP

(57) ABSTRACT

Systems and methods are provided for providing a multi-body interaction among a plurality of qubits. A first persistent current qubit is galvanically coupled to a second persistent current qubit through a Josephson junction. A third persistent current qubit is galvanically coupled to one or both of the first persistent current qubit and the second persistent current qubit along a superconducting loop interrupted by the first persistent current qubit, the second persistent current qubit, the third persistent current qubit, and the Josephson junction.

20 Claims, 7 Drawing Sheets

MULTI-BODY INTERACTION IN GALVANICALLY COUPLED QUBITS

TECHNICAL FIELD

This invention relates to superconducting circuits, and more particularly, to a system of three or more galvanically coupled qubits having a multi-body interaction.

BACKGROUND

Quantum annealing systems and some protected quantum bits and gates benefit from strong, pure multibody interactions, but these interactions can be difficult to provide. Current approaches to creating multibody interactions suffer in their ability to create strong and pure interactions between qubits with very large loop inductances, such as persistent current qubits like the fluxonium qubit. Typically it is challenging to avoid undesired two-body interactions (e.g., ZZ couplings) because of the coupling geometry.

SUMMARY OF THE INVENTION

In accordance with an aspect of the present invention, a system includes a first persistent current qubit galvanically coupled to a second persistent current qubit through a Josephson junction. A third persistent current qubit is galvanically coupled to one or both of the first persistent current qubit and the second persistent current qubit along a superconducting loop interrupted by the first persistent current qubit, the second persistent current qubit, the third persistent current qubit, and the Josephson junction.

In accordance with another aspect of the present invention, a method is provided for providing a ZZZ coupling among three persistent current qubits galvanically connected to one another to form a superconducting loop. An applied flux is provided to the superconducting loop with a first value to provide a first ZZZ coupling among the three persistent current qubits. The first ZZZ coupling has a first set of four lowest energy states. The applied flux is provided to the superconducting loop with a second value to provide a second ZZZ coupling among the three persistent current qubits. The second ZZZ coupling has a second set of four lowest energy states. The applied flux is provided to the superconducting loop with a third value to avoid a ZZZ coupling among the three persistent current qubits.

In accordance with yet another aspect of the present invention, a system includes a first persistent current qubit that includes a first superconducting loop interrupted by a first Josephson junction and a first inductor. A second persistent current qubit includes a second superconducting loop interrupted by a second Josephson junction and a second inductor. The second persistent current qubit is galvanically coupled to the first persistent current qubit through a third Josephson junction. A third persistent current qubit includes a third superconducting loop interrupted by a fourth Josephson junction and a third inductor. The third persistent current qubit is galvanically coupled to one or both of the first persistent current qubit and the second persistent current qubit along a fourth superconducting loop interrupted by the first persistent current qubit, the second persistent current qubit, the third persistent current qubit, and the third Josephson junction.

DETAILED DESCRIPTION OF THE INVENTION

A "persistent current qubit", as used herein, is a qubit having a state that is characterized by a persistent current circulating within the qubit. Examples of persistent current qubits include the flux qubit and the fluxonium qubit.

Two quantities are "about equal" when they are equal within fabrication tolerances. Two values for an applied flux are "about equal" when they are with five-hundredths of the flux quantum. A negative value for an applied flux is a flux applied in a direction that opposed an arbitrarily chosen direction associated with positive values for an applied flux.

Figure 1:
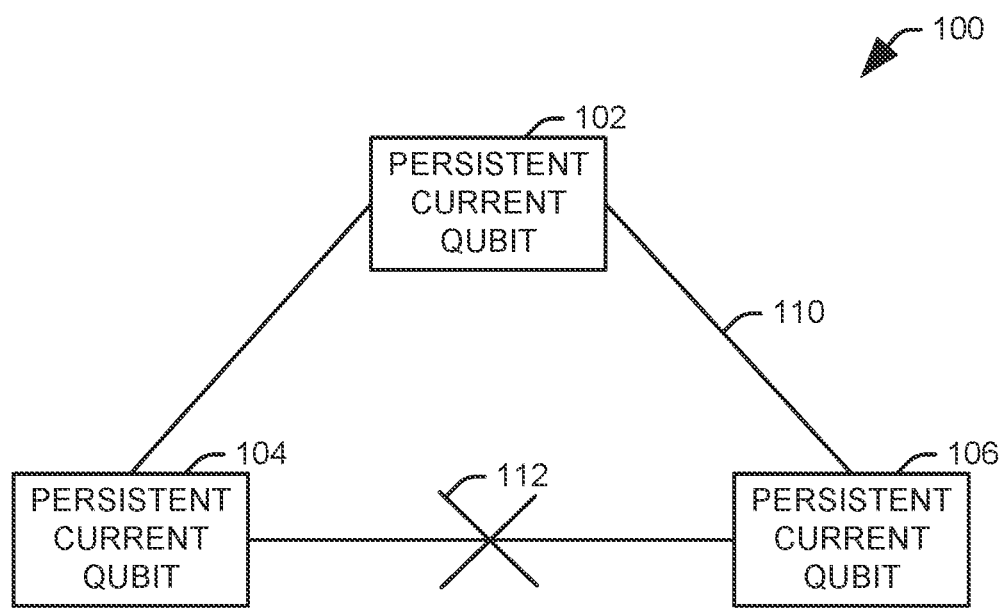
FIG. 1 illustrates system for providing a multi-body interaction among three persistent current qubits.

FIG. 1 illustrates system 100 for providing a multi-body interaction among a plurality of persistent current qubits 102, 104, and 106. In the illustrated implementation, the system 100 includes three persistent current qubits 102, 104, and 106 as an example, although it will be appreciated that the system 100 can be implemented to provide a multi-body interaction among more than three qubits. In this example, each of the persistent current qubits 102, 104, and 106 have at least two Josephson junctions in one loop with sufficiently large shunt capacitance to prohibit quantum tunneling of superconducting phase, as to provide a periodic double-well potential for the qubit. In one implementation, each of the persistent current qubits 102, 104, and 106, can be implemented as a fluxonium qubit.

Each of the plurality of persistent current qubits (e.g., 102) is galvanically coupled to two other persistent current qubits (e.g., 104 and 106) as to form a superconducting loop 110 including the persistent current qubits. The superconducting loop 110 is interrupted by a Josephson junction 112 between two of the persistent current qubits (e.g., 104 and 106). It will be appreciated that the Josephson junction 110 can be implemented, in some examples, as a compound Josephson junction comprising multiple Josephson junctions arranged in parallel to allow for additional tunability of the system 100. In some implementations, additional inductors (not shown) can be including in the galvanic connections between the other pairs of persistent current qubits. For example, in this example using three qubits, the inductors could be implemented between qubits 102 102 and 106 and between qubits 102 and 104.

Figure 2:
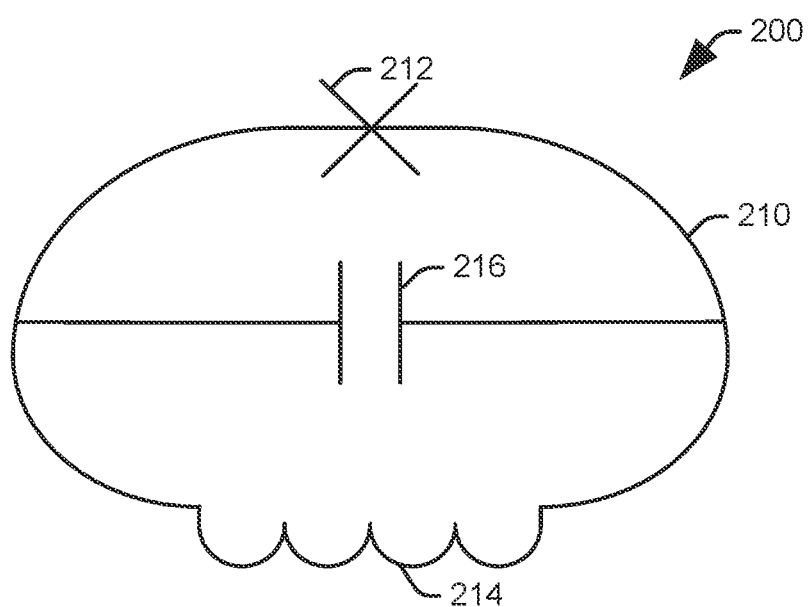
FIG. 2 illustrates a first example of a persistent current qubit circuit that can be used in the system of FIG. 1, specifically a fluxonium qubit.

FIG. 2 illustrates a first example of a persistent current qubit circuit 200 that can be used in the system of FIG. 1, specifically a fluxonium qubit. The circuit includes a superconducting loop 210 interrupted by a Josephson junction 212 and an inductor 214 and shunted by a capacitor 216. The inductor 214 can be implemented using any appropriate structure, for example, a geometric inductance or a series of Josephson junctions. Since the inductor 214 can itself be formed from a series of Josephson junctions in some implementations, the Josephson junction 212 of a fluxonium qubit is often referred to as the "black sheep" junction, as it is generally implemented with a smaller critical current than any Josephson junctions used to provide the inductor 214. In the illustrated implementation, however the Josephson junction 212 can be fabricated to have a relatively large critical current, for example, a critical current greater than one hundred fifty nanoamps. In another example, the "black sheep" Josephson junction 212 can be fabricated to have a critical current within twenty percent of the critical current of one of a series of inductors used to fabricate the inductor 214. In a further example, the "black sheep" Josephson junction 212 can be fabricated to have a critical current about equal to the critical current of one of a series of inductors used to fabricate the inductor 214.

Figure 3:
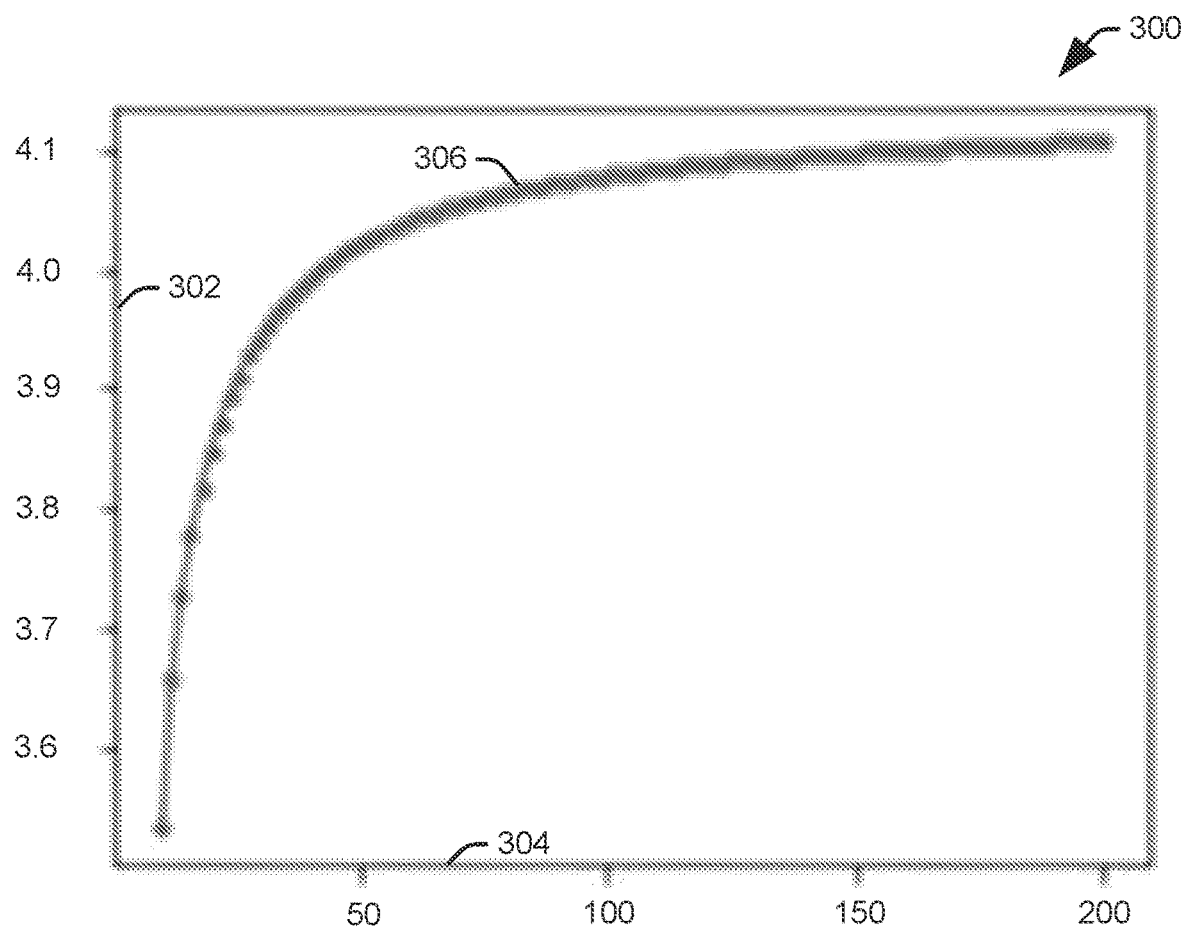
FIG. 3 is a chart illustrating a simulation of the persistent current circulating in a fluxonium qubit as a function of the critical current of the Josephson junction.

FIG. 3 is a chart 300 illustrating a simulation of the persistent current circulating in a fluxonium qubit, represented on a vertical axis 302 in nanoamps, as a function of the critical current of the Josephson junction 212, represented on a horizontal axis 304 in nanoamps. In the simulation, a large shunt capacitance is used and small flux bias from an operating point at half a flux quantum are added so that the ground state wavefunction is localized in one well. Specifically, the simulation assumes an inductance of two hundred nanohenries for the inductor 214, a capacitance for the capacitor 216 of one hundred femtofarads, and a 0.1 m$\Phi_0$, deviation of the flux bias from 0.5 $\Phi_0$, where $\Phi_0$ is the flux quantum. As can be seen from the plot 306, an increase in the critical current of the Josephson junctions does not greatly increase the persistent current, and therefore does not significantly increase flux-noise induced dephasing when the qubit is operating away from a "sweet spot" frequency at which tunnel-coupling is present and a fluxonium qubit is generally operated. In fact, the persistent current increases by only sixteen percent when the critical current is increased by over an order of magnitude. Thus, the qubits discussed here with larger junction 212 critical currents may have similar dephasing to a standard fluxonium circuit, with its smaller junction critical current, when operated off the standard sweet spot. This increased dephasing may be acceptable in applications where a strong, pure ZZZ interaction is desired, and can be mitigated to some degree by increasing the inductance of the inductor 214.

Figure 4:
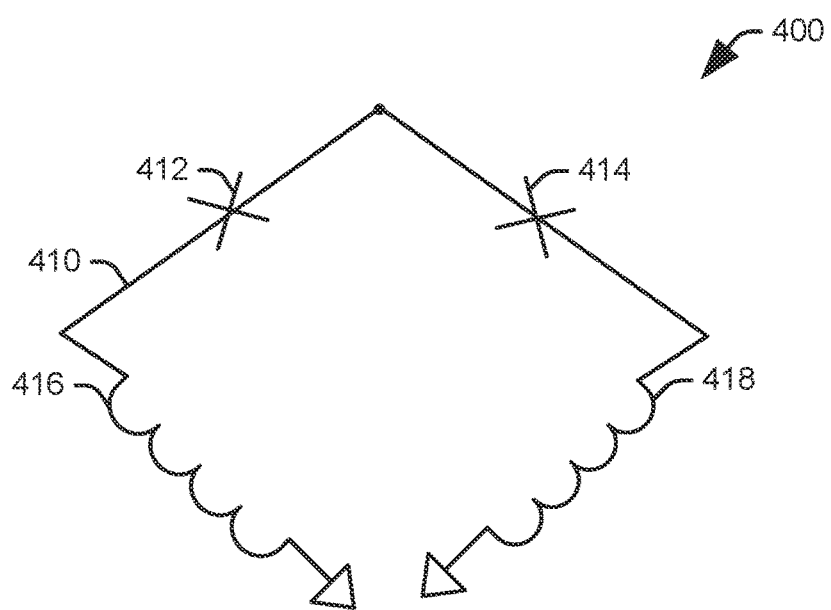
FIG. 4 shows another example of a persistent current qubit circuit that can be used in the ZZZ coupling arrangement of FIG. 1.

FIG. 4 shows another example of a persistent current qubit circuit 400 that can be used in the ZZZ coupling arrangement of FIG. 1. The illustrated persistent current qubit 400 comprises a superconducting loop 410 comprising a first inductor 412, a second inductor 414, a first Josephson junction 416, and a second Josephson 418. The two Josephson junctions 416 and 418 have about identical critical currents and have much larger critical currents than the typical black sheep junction. With half a flux quantum in the loop, the circuit exhibits a double-well potential that is periodic in the phase on the top junction. This periodicity gives rise to two inequivalent tunneling paths between the two wells, which, in turn, gives rise to Aharonov-Casher interference for some device parameters. With a sufficiently large shunt capacitance across the junctions (not shown), this tunneling and the associated interference is highly suppressed.

Figure 5:
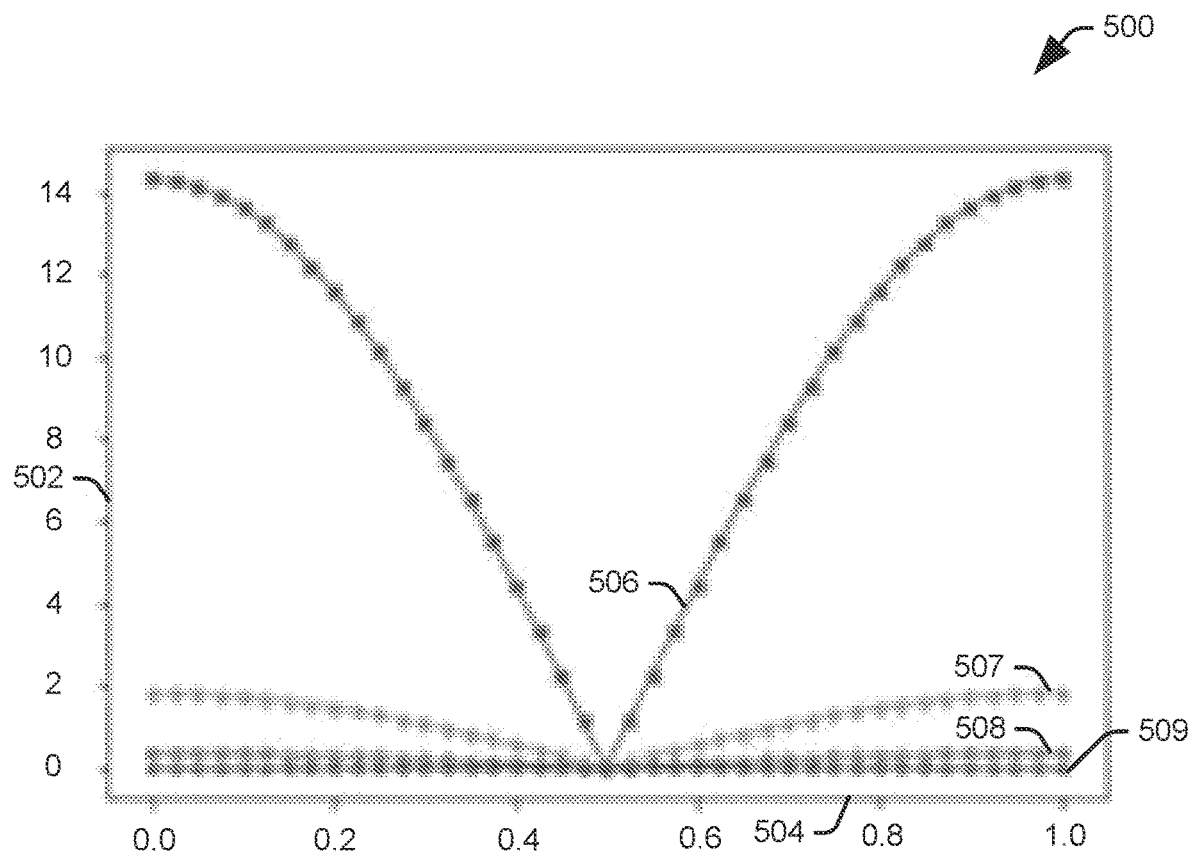
FIG. 5 is a chart illustrating an energy splitting between the two lowest energy levels for the qubit of FIG. 4 as a function of an offset charge at the node of the circuit between the two Josephson junctions.

FIG. 5 is a chart 500 illustrating an energy splitting between the two lowest energy levels for the qubit of FIG. 4, represented on a vertical axis 502 in megahertz, as a function of an offset charge at the node of the circuit between the two Josephson junctions 412 and 414, represented on the horizontal axis 504 in units of twice the electron charge. For this example, the inductances of the inductors 412 and 414 are each one hundred twenty-five nanohenries with a five femtofarad shunt capacitance, and the Josephson junctions 416 and 418 have critical current of two hundred nanoamps. Each plot 506-509 represents a different shunt capacitance across the junctions 416 and 418, with a first plot 506 representing a shunt capacitance of one femtofarad, a second plot 507 representing a shunt capacitance of two femtofarads, a third plot 508 representing a shunt capacitance of three femtofarads, and a fourth plot 509 representing a shunt capacitances of fifteen femtofarads. With one-half of a flux quantum provided to the superconducting loop 210, a double well potential is formed with two inequivalent tunnelling paths between wells. Tunneling exhibits Aharonov-Casher interference, which is controlled by the offset charge, and is suppressed by increasing the junction shunt capacitances. With fifteen femtofarad capacitive shunts, tunnel-splitting is suppressed well below 0.1 kHz for any offset charge, while the gap to the next highest states is 6.4 GHz. These simulations provide evidence that the energy potential for the qubit 400 exhibits a periodicity of period $\pi$ as a function of a Josephson phase associated with the node of the circuit between the two Josephson junctions 412 and 414, such that the energy potential contains two minima in the interval zero to $2\pi$.

Figure 6:
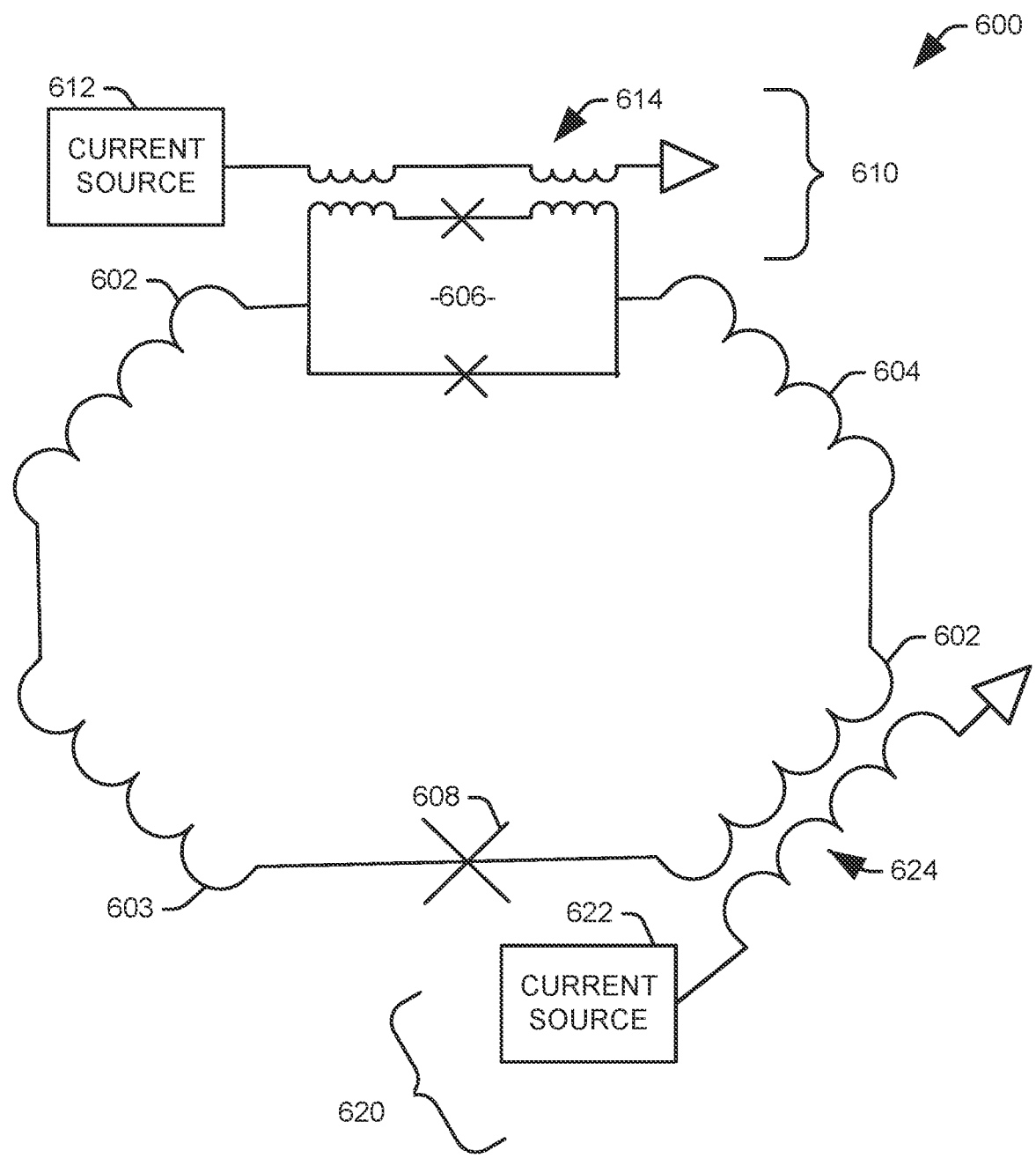
FIG. 6 illustrates another example of a qubit that can be used in the ZZZ coupling arrangement of FIG. 1.

FIG. 6 illustrates another example of a qubit 600 that can be used in the ZZZ coupling arrangement of FIG. 1. The qubit 600, is implemented as a fluxonium qubit and includes a superconducting loop 601 containing four inductors 602-605 and two Josephson junctions 606 and 608. The inductors 602-605 will be selected to have inductances that are significantly larger than the inductances associated with the Josephson junctions and can be implemented, for example, via Josephson junction chains, high kinetic inductance superconducting material, or long superconducting wires. In the illustrated example, a first Josephson junction 606 is implemented as a compound junction to allow for tuning of a tunnel barrier height of the energy potential of the qubit via applied flux. The second Josephson junction 608 is included to manifest a desired periodicity in the circuit's potential energy as a function of superconducting phase difference between the nodes of the circuit labelled as A and B. In the illustrated implementation, the critical current of the first Josephson junction 606 is about equal to the critical current of the second Josephson junction. The first Josephson junction 606 is configured to receive flux from a first control line 610 comprising a first current source 612 and a first transformer 614. Similarly, the superconducting loop is configured to receive flux from a second control line 620 comprising a second current source 622 and a second transformer 624. In the illustrated example, the second transformer 624 includes one of the inductors 605.

Figure 7:
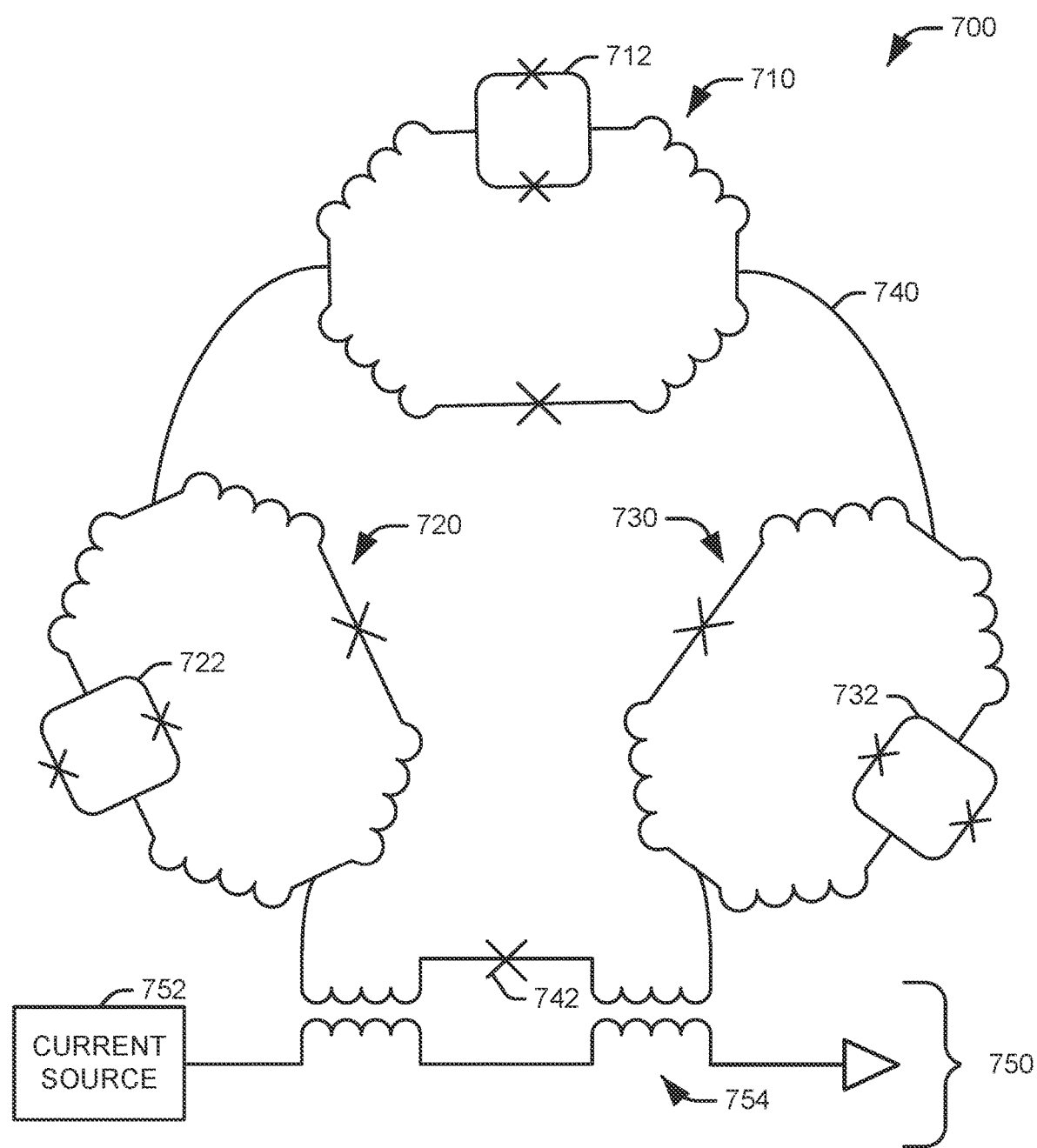
FIG. 7 illustrates a system implementing a ZZZ coupling arrangement using the qubit of FIG. 6.

FIG. 7 illustrates a system 700 implementing a ZZZ coupling arrangement using the qubit 600 of FIG. 6. The system 700 includes three tunable fluxonium qubits 710, 720, and 730, each implemented as illustrated in FIG. 6 and connected to one another at circuit nodes A and B to form a loop 740. Each of the three tunable fluxonium qubits 710, 720, and 730 includes a compound Josephson junction 712, 722, and 732 configured to receive flux via a control line (not shown). The loop 740 is interrupted by a Josephson junction 742 on a connection between two of the fluxonium qubits (e.g., 710 and 720) and configured to receive flux from a control line 750 comprising a current source 752 and a transformer 754. In some implementations, the remaining connections between the qubits (e.g., between 720 and 730 and between 710 and 730) can include inductors (not shown), for example, implemented in a manner similar to the inductors 602-605 in the qubits.

Figure 8:
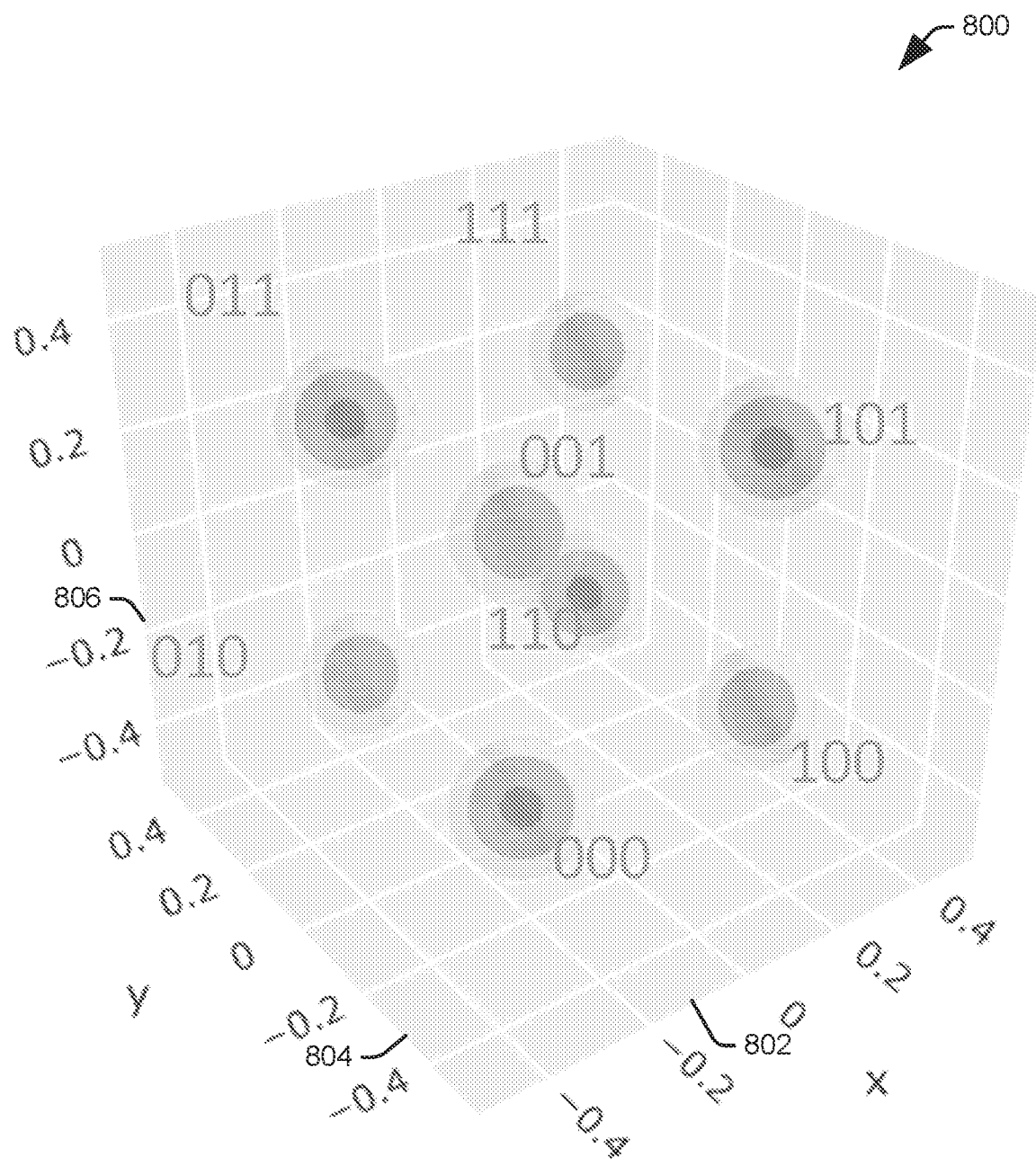
FIG. 8 is a three-dimensional representation of an energy potential for the system of FIG. 7.

During operation, the system 700 can be provided with flux at the compound Josephson junctions 712, 714, and 716 in each qubit as well as in the main loop 740 itself. The potential minima of the system 700 as a function of phase difference across the fluxonium qubits forms a lattice in three-dimensional space, where each vertex is a potential minimum. A representation of this lattice 800 is illustrated as FIG. 8, where the potential, Ep, can be represented in simplified form as $$E_P = \cos(2x) + \cos(2y) + \cos(2z) - a * \cos\left(\frac{2\pi\Phi}{\Phi_0} - x - y - z\right),$$

where each cosine term represents a potential of one of the three qubits 710, 720, and 730, $\Phi$ is a value of a flux applied to the loop 740, $\Phi_0$ is the flux quantum, and a is a relative coupling strength. A first axis 802 represents a value for x, a second axis 804 represents a value for y, and a third axis 806 represents a value for z. Each potential energy minimum of the system corresponds to specific persistent currents of the three qubits, where 0/1 corresponds to clockwise/counter-clockwise circulating current. For example, the minimum labeled 000 has an associated quantum state |000> in which all three qubits have clockwise circulating current.

Connecting the qubits 710, 720, and 730 in the loop 740 constrains the sum of the phases across each qubit. The constraint forms a plane in the three-dimensional space of the qubit phases that is translated by flux in the multi-qubit ring. When a flux of about 0.25 $\Phi_0$, is provided to the loop 740, four phase minima lie in the plane which correspond to the ground states of the ZZZ interaction, specifically |011>, |101>, |110>, and |000>. When a flux of about −0.25 $\Phi_0$, is provided to the loop 740. The sign of the interaction is flipped for ring flux of −0.25 $\Phi_0$, with the plane representing the ground states translated to include the states |100>, |010>, |001>, and |111>. For qubits 710, 720, and 730 having an inductance of two hundred nanohenries for the inductor, a capacitance for the capacitor of one hundred femtofarads, and Josephson junctions having a critical current about equal to one hundred fifty milliamps, the system 700 can provide a coupling strength greater than one gigahertz.

Figure 9:
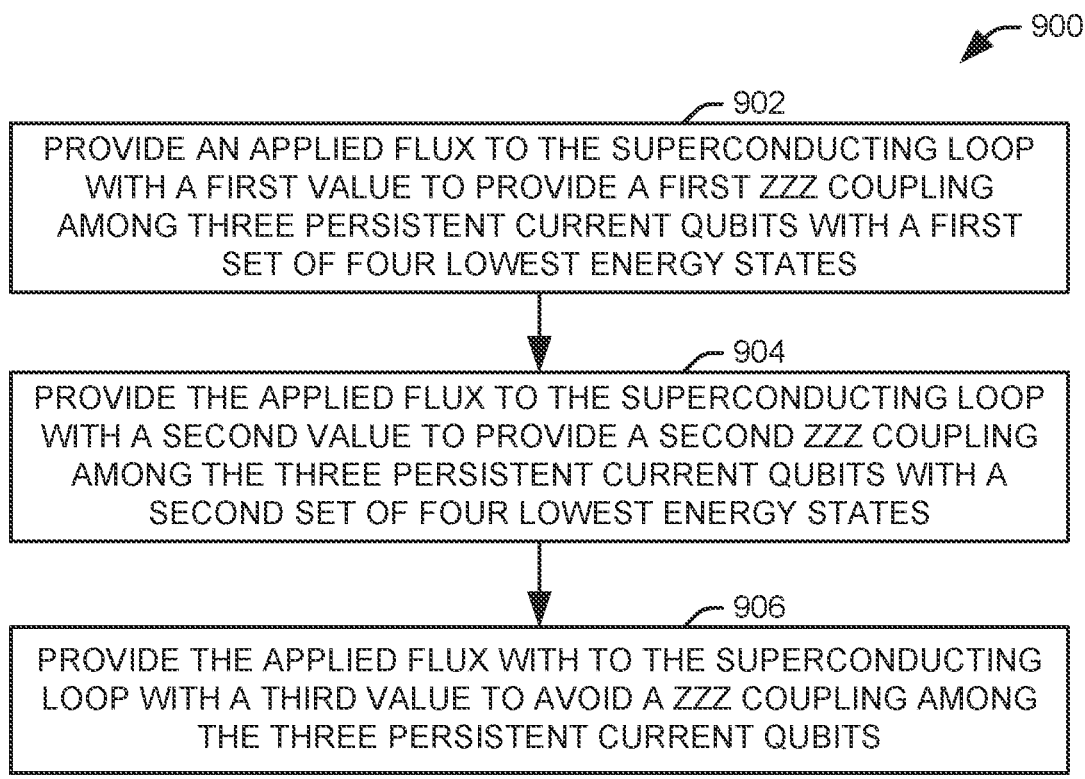
FIG. 9 illustrates a method for providing a ZZZ coupling among three persistent current qubits galvanically connected to one another to form a superconducting loop.

In view of the foregoing structural and functional features described above, a method in accordance with various aspects of the present invention will be better appreciated with reference to FIG. 9. While, for purposes of simplicity of explanation, the method of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a method in accordance with an aspect the present invention.

FIG. 9 illustrates a method 900 for providing a ZZZ coupling among three persistent current qubits galvanically connected to one another to form a superconducting loop. At 902, an applied flux is provided to the superconducting loop with a first value to provide a first ZZZ coupling among the three persistent current qubits. The first ZZZ coupling has a first set of four lowest energy states. The applied flux can be provided to the superconducting loop by providing a current to a control line inductively coupled to the superconducting loop. At 904, the applied flux is provided to the superconducting loop with a second value to provide a second ZZZ coupling among the three persistent current qubits. The second ZZZ coupling has a second set of four lowest energy states. At 906, the applied flux is provided to the superconducting loop with a third value to avoid a ZZZ coupling among three persistent current qubits.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system, comprising:
   a first persistent current qubit;
   a second persistent current qubit galvanically coupled to the first persistent current qubit through a Josephson junction;
   a third persistent current qubit galvanically coupled to at least one of the first persistent current qubit and the second persistent current qubit along a superconducting loop interrupted by the first persistent current qubit, the second persistent current qubit, the third persistent current qubit, and the Josephson junction.

2. The system of claim 1, wherein each of first persistent current qubit, the second persistent current qubit, and the third persistent current qubit comprise a superconducting loop interrupted by a Josephson junction and an inductor.

3. The system of claim 2, wherein the Josephson junction associated with the first persistent current qubit has a critical current greater than one hundred fifty milliamps.

4. The system of claim 2, wherein the Josephson junction associated with the first persistent current qubit is a compound Josephson junction.

5. The system of claim 2, wherein the inductor associated with the first persistent current qubit is fabricated as a series of Josephson junctions.

6. The system of claim 5, wherein the Josephson junction associated with the first persistent current qubit has a critical current within twenty percent of a critical current of one of the series of Josephson junctions.

7. The system of claim 5, wherein the Josephson junction associated with the first persistent current qubit has a critical current about equal to a critical current of one of the series of Josephson junctions.

8. The system of claim 1, wherein the superconducting loop is interrupted by the first persistent current qubit, the second persistent current qubit, the third persistent current qubit, the Josephson junction, and a fourth persistent current qubit that is galvanically coupled to the third persistent current qubit.

9. The system of claim 8, wherein the system provides a first ZZZ coupling, having a first set of four lowest energy states, among the first persistent current qubit, the second persistent current qubit, and the third persistent current qubit when the control flux is provided with a first value, the system provides a second ZZZ coupling, having a second set of lowest energy states that is different from the first set of four lowest energy states, among the first persistent current qubit, the second persistent current qubit, and the third persistent current qubit when the control flux is provided with a second value, and no ZZZ coupling when the control flux is provided with a third value.

10. The system of claim 9, wherein the first value is about equal to one-quarter of a flux quantum, the second value is about equal to negative one-quarter of a flux quantum, and the third value is about equal to zero.

11. The system of claim 9, wherein the first set of four lowest energy states includes the states |011>, |101>, |110>, and |000>, and the second set of four lowest energy states includes the states |100>, |010>, |001>, and |111>.

12. A method for providing a ZZZ coupling among three persistent current qubits galvanically connected to one another to form a superconducting loop, the method comprising:
providing an applied flux to the superconducting loop with a first value to provide a first ZZZ coupling among the three persistent current qubits, the first ZZZ coupling having a first set of four lowest energy states;
providing the applied flux to the superconducting loop with a second value to provide a second ZZZ coupling among the three persistent current qubits, the second ZZZ coupling having a second set of four lowest energy states; and
providing the applied flux to the superconducting loop with a third value to avoid a ZZZ coupling among the three persistent current qubits.

13. The method of claim 12, wherein the first value is about equal to one-quarter of a flux quantum, the second value is about equal to negative one-quarter of a flux quantum, and the third value is about equal to zero.

14. The method of claim 12, wherein the first set of four lowest energy states includes the states |011>, |101>, |110>, and |000>, and the second set of four lowest energy states includes the states |100>, |010>, |001>, and |111>.

15. The method of claim 12, wherein providing the applied flux to the superconducting loop comprises providing a current to a control line inductively coupled to the superconducting loop.

16. A system, comprising:
a first persistent current qubit comprising a first superconducting loop interrupted by a first Josephson junction and a first inductor;
a second persistent current qubit comprising a second superconducting loop interrupted by a second Josephson junction and a second inductor and galvanically coupled to the first persistent current qubit through a third Josephson junction;
a third persistent current qubit comprising a third superconducting loop interrupted by a fourth Josephson junction and a third inductor and galvanically coupled to one of the first persistent current qubit and the second persistent current qubit along a fourth superconducting loop interrupted by the first persistent current qubit, the second persistent current qubit, the third persistent current qubit, and the third Josephson junction.

17. The system of claim 16, further comprising a control line configured to provide a control flux to the superconducting loop, wherein the system provides a first ZZZ coupling, having a first set of four lowest energy states, among the first persistent current qubit, the second persistent current qubit, and the third persistent current qubit when the control flux is provided with a first value, the system provides a second ZZZ coupling, having a second set of lowest energy states that is different from the first set of four lowest energy states, among the first persistent current qubit, the second persistent current qubit, and the third persistent current qubit when the control flux is provided with a second value, and no ZZZ coupling when the control flux is provided with a third value.

18. The system of claim 17, wherein the first value is about equal to one-quarter of a flux quantum, the second value is about equal to negative one-quarter of a flux quantum, and the third value is about equal to zero.

19. The system of claim 17, wherein the first set of four lowest energy states includes the states |011>, |101>, |110>, and |000>, and the second set of four lowest energy states includes the states |100>, |010>, |001>, and |111>.

20. The system of claim 16, wherein the first Josephson junction has a critical current greater than one hundred fifty milliamps.

* * * * *